United States Patent
Kang

(10) Patent No.: US 7,453,744 B2
(45) Date of Patent: Nov. 18, 2008

(54) BUFFER CONTROL CIRCUIT, SEMICONDUCTOR MEMORY DEVICE FOR MEMORY MODULE INCLUDING THE BUFFER CONTROL CIRCUIT, AND CONTROL METHOD OF THE BUFFER CONTROL CIRCUIT

(75) Inventor: Shin Deok Kang, Kyeongki-do (KR)

(73) Assignee: Hynix Semiconductor Inc., Kyoungki-do (KR)

( * ) Notice: Subject to any disclaimer, the term of this patent is extended or adjusted under 35 U.S.C. 154(b) by 234 days.

(21) Appl. No.: 11/490,242

(22) Filed: Jul. 21, 2006

(65) Prior Publication Data
US 2007/0146375 A1    Jun. 28, 2007

(30) Foreign Application Priority Data
Dec. 27, 2005   (KR) ...................... 10-2005-0130515

(51) Int. Cl.
G11C 7/00    (2006.01)
(52) U.S. Cl. .......................... 365/189.16; 365/189.05

(58) Field of Classification Search ............. 365/189.16
See application file for complete search history.

(56) References Cited

U.S. PATENT DOCUMENTS 3,621,389 A * 11/1971 Murray ..................... 324/76.24
4,771,402 A * 9/1988 Nakabayashi ............... 711/217
5,268,865 A * 12/1993 Takasugi ............... 365/189.18
5,930,177 A * 7/1999 Kim ..................... 365/189.05
6,466,492 B2 * 10/2002 Ikeda ......................... 365/195

* cited by examiner

*Primary Examiner*—Tan T. Nguyen
(74) *Attorney, Agent, or Firm*—Lowe Hauptman Ham & Berner, LLP

(57) ABSTRACT

A buffer control circuit, a semiconductor memory device for a memory module including the buffer control circuit, and a control method of the buffer control circuit, in which power consumption can be reduced. The buffer control circuit includes a first control signal generator that generates an internal buffer control signal in response to write latency signals and internal control signals, and a second control signal generator that generates a buffer control signal in response to the internal buffer control signal and a termination control signal. It is therefore possible to reduce unnecessary power consumption incurred by a data input buffer.

33 Claims, 8 Drawing Sheets

BUFFER CONTROL CIRCUIT, SEMICONDUCTOR MEMORY DEVICE FOR MEMORY MODULE INCLUDING THE BUFFER CONTROL CIRCUIT, AND CONTROL METHOD OF THE BUFFER CONTROL CIRCUIT

BACKGROUND

1. Field of the Invention

The present invention generally relates to a semiconductor memory device, and more particularly, to a buffer control circuit of a semiconductor memory device and control method thereof.

2. Discussion of Related Art

In general, a semiconductor memory device includes a data input buffer that receives data from an external device and outputs the externally input data to an internal core circuit including a memory cell array, during a write operation. When the data input buffer is enabled to perform the operation of receiving the external input data, current consumption of the semiconductor memory device rises abruptly. This is because the data input buffer receives the external input data through an external transmission line having a relatively high resistance value.

To reduce current consumption by the data input buffer, it is very important to control the data input buffer to be disabled during the remaining periods except for the period in which the data input buffer must operate. To this end, the semiconductor memory device includes a buffer control circuit for enabling or disabling the data input buffer by generating a control signal.

The construction and operation of the buffer control circuit in the related art will be described in short below with reference to FIGS. 1 and 2. FIG. 1 is a block diagram of a buffer control circuit and data I/O circuits of a semiconductor memory device in the related art.

Data input buffers INB1 to INBJ and data output buffers OUTB1 to OUTBJ of data I/O circuits DATC1 to DATCJ (J is an integer) are connected to I/O pads P1 to PJ, respectively. For example, the data input buffer INB1 and the data output buffer OUTB1 can be connected to the I/O pad P1. The data input buffers INB1 to INBJ are enabled or disabled in response to a buffer control signal ENDINDSB1.

Preferably, when the buffer control signal ENDINDSB1 is disabled, the data input buffers INB1 to INBJ is enabled. When the data input buffers INB1 to INBJ are enabled, they receive external input data WDAT1 to WDATJ, respectively, through the I/O pads P1 to PJ and output internal input data INDAT1 to INDATJ, respectively. The data output buffers OUTB1 to OUTBJ receive the internal output data OUTDAT1 to OUTDATJ, respectively, and output external output data RDAT1 to RDATJ, respectively, to the I/O pads P1 to PJ.

Meanwhile, a buffer control circuit 10 generates the buffer control signal ENDINDSB1 in response to write latency signals WL1 to WL3 and internal control signals CKEBCOM, RASIDLE, DOFFB1, and WTSTDB. In more detail, the buffer control circuit 10 disables the buffer control signal ENDINDSB1 when the internal control signal RASIDLE is disabled and enables the buffer control signal ENDINDSB1 when the internal control signal DOFFB1 or the internal control signal RASIDLE is enabled.

During the read operation of the semiconductor memory device including the buffer control circuit 10, the internal control signal DOFFB1 is enabled while the data output buffers OUTB1 to OUTBJ output the external output data RDAT1 to RDATJ to the I/O pads P1 to PJ, respectively. As a result, the buffer control circuit 10 enables the buffer control signal ENDINDSB1 in response to the control signal DOFFB1 during the period in which the control signal RASIDLE is disabled (i.e., during the active period of the semiconductor memory device). However, in the event that the buffer control circuit 10 generates the buffer control signal ENDINDSB1 based on the control signal DOFFB1, a circuit designer may encounter lots of difficulties in designing the buffer control circuit 10.

In more detail, the buffer control circuit 10 is disposed close to the data input buffer in order to rapidly execute the control operation of the data input buffer. However, a control signal generator (not shown) that generates the control signal DOFFB1 is disposed far away from the data input buffer because it has to receive a variety of control signals of a control circuit block (not shown). As semiconductor chips are miniaturized due to the developments of semiconductor manufacturing technology, however, a designing work for routing a signal line that transfers the control signal DOFFB1 from the control signal generator to the buffer control circuit 10 becomes more difficult.

In the case where the buffer control circuit 10 generates the buffer control signal ENDINDSB1 based on the control signal DOFFB1, a problem arises because the buffer control circuit 10 operates even during a period in which the data input buffers INB1 to INBJ need not to be driven actually. This problem may become more profound when the semiconductor memory device including the buffer control circuit 10 is applied to semiconductor devices in which a plurality of semiconductor memory devices (i.e., memory ranks) are disposed on one chip in the same manner as the memory module.

The operation of the buffer control circuit 10 when the semiconductor memory device including the buffer control circuit 10 is disposed in a memory module will be described below with reference to FIG. 2. It is assumed that the memory module includes first to $U^{th}$ (U is an integer) semiconductor memory devices (not shown), each of which has the buffer control circuit 10. It is also assumed that after an active command ACT is inputted to the first to $U^{th}$ semiconductor memory devices at the same time and read commands READ1 to READU are sequentially inputted to the first to $U^{th}$ semiconductor memory devices, a precharge command PRECH is inputted to the first to $U^{th}$ semiconductor memory devices at the same time.

In FIG. 2, chip selection signals CSB1 to CSBU are signals for selecting the first to $U^{th}$ semiconductor memory devices, respectively, and internal control signals DOFFB1 to DOFFBU are generated from the first to $U^{th}$ semiconductor memory devices, respectively. Furthermore, the buffer control signal ENDINDSB1 enables or disables the data input buffers INB1 to INBJ of the first semiconductor memory device.

If the active command ACT is inputted to the first to $U^{th}$ semiconductor memory devices at the same time, the first to $U^{th}$ semiconductor memory devices are respectively activated. Thereafter, if the read commands READ1 to READU are sequentially inputted to the first to $U^{th}$ semiconductor memory devices, respectively, the first to $U^{th}$ semiconductor memory devices sequentially operate the read operation. At this time, the internal control signals DOFFB1 to DOFFBU are respectively enabled only when corresponding ones of the first to $U^{th}$ semiconductor memory devices output the external output data RDAT1 to RDATJ to the outside. It is to be understood that only timing diagrams of the external output data RDAT1 of each of the first to $U^{th}$ semiconductor memory devices is shown in FIG. 2 for simplification.

The internal control signal DOFFB1 is enabled while the first semiconductor memory device outputs the external output data RDAT1 to the outside. Accordingly, the buffer control circuit 10 of the first semiconductor memory device enables the buffer control signal ENDINDSB1 during a period T1 in which the internal control signal DOFFB1 is enabled and disables the buffer control signal ENDINDSB1 again after the period T1. As a result, the data input buffers INB1 to INBJ of the first semiconductor memory device are disabled during the period T1 and are enabled again after the period T1.

It is not necessary for the data input buffers INB1 to INBJ of the first semiconductor memory device to operate during the period T2 in which each of the second to $U^{th}$ semiconductor memory devices performs the read operation. As a result, there is a problem in that the data input buffers INB1 to INBJ of the first semiconductor memory device consume power unnecessarily during the period T2.

There is also a problem in which the data input buffers INB1 to INBJ of each of the second to $U^{th}$ semiconductor memory devices consume power unnecessarily during periods other than the read operation period of each of the second to $U^{th}$ semiconductor memory devices. This problem may become more profound when the number of semiconductor memory devices included in a memory module is increased.

SUMMARY OF THE INVENTION

An embodiment of the present invention is that it provides a buffer control circuit, in which it can reduce unnecessary power consumption incurred by a data input buffer, by generating a buffer control signal based on a control signal for a termination unit.

Another embodiment of the present invention is that it provides a semiconductor memory device for a memory module, in which it can reduce unnecessary power consumption incurred by a data input buffer, by generating a buffer control signal based on a control signal for a termination unit.

Further another embodiment of the present invention is that it provides a control method of a buffer control circuit, in which it can reduce unnecessary power consumption incurred by a data input buffer, by generating a buffer control signal based on a control signal for a termination unit.

According to an aspect of the present invention, a buffer control circuit includes a first control signal generator and a second control signal generator. The first control signal generator generates an internal buffer control signal in response to write latency signals and internal control signals. The second control signal generator generates a buffer control signal in response to the internal buffer control signal and a termination control signal. The termination control signal may be enabled for a predetermined time during a read operation of a semiconductor memory device including a termination unit and the buffer control circuit. The predetermined time may be decided by a read command inputted to the semiconductor memory device, and Column Address Strobe (CAS) latency and a burst length burst length set in the semiconductor memory device. The termination unit may be enabled or disabled in response to the termination control signal.

According to another aspect of the present invention, a semiconductor memory device for a memory module includes a buffer control circuit, a plurality of data input buffers, and a plurality of termination units. The buffer control circuit generates a buffer control signal in response to write latency signals, internal control signals, and a termination control signal. The plurality of data input buffers are connected to a plurality of I/O pads, respectively, through a plurality of data input lines. The input buffers receive external input data, which are respectively inputted to the plurality of I/O pads, respectively, and output internal input data to an internal circuit including a core circuit, in response to the buffer control signal during a write operation of the semiconductor memory device. The plurality of termination units are connected to the plurality of data input lines, respectively, and match impedances of the plurality of data input lines to predetermined values, respectively, in response to the termination control signal.

According to further another aspect of the present invention, a semiconductor memory device for a memory module includes a buffer control circuit, a plurality of data input buffers, and a plurality of termination units. The plurality of buffer control circuits generate a plurality of buffer control signals, respectively, in response to write latency signals, internal control signals, and a termination control signal, respectively. The plurality of data input buffers are connected to a plurality of I/O pads, respectively, through a plurality of data input lines. The data input buffers receive external input data, which are respectively inputted to the plurality of I/O pads, respectively, and output internal input data to an internal circuit including a core circuit, in response to the plurality of buffer control signals, respectively, during a write operation of the semiconductor memory device. Furthermore, the plurality of termination units are connected to the plurality of data input lines, respectively, and match impedances of the plurality of data input lines to predetermined values, respectively, in response to the termination control signal.

According to further another aspect of the present invention, there is provided a control method of a buffer control circuit that controls at least one data input buffer in a semiconductor memory device for a memory module, including the at least one data input buffer and at least one termination unit, including the steps of generating an internal buffer control signal in response to write latency signals and internal control signals, and generating a buffer control signal in response to the internal buffer control signal and a termination control signal, thereby enabling or disabling the at least one data input buffer. The termination control signal may control the operation of the at least one termination unit and may be enabled for a predetermined time during a read operation of the semiconductor memory device. The predetermined time may be decided by a read command inputted to the semiconductor memory device, and CAS latency and a burst length set in the semiconductor memory device.

BRIEF DESCRIPTION OF THE DRAWINGS

A more complete appreciation of the invention, and many of the attendant advantages thereof, will be readily apparent as the same becomes better understood by reference to the following detailed description when considered in conjunction with the accompanying drawings in which like reference symbols indicate the same or similar components, wherein.

DETAILED DESCRIPTION OF EMBODIMENTS

The present invention will now be described in detail in connection with certain exemplary embodiments with reference to the accompanying drawings.

Figure 1:
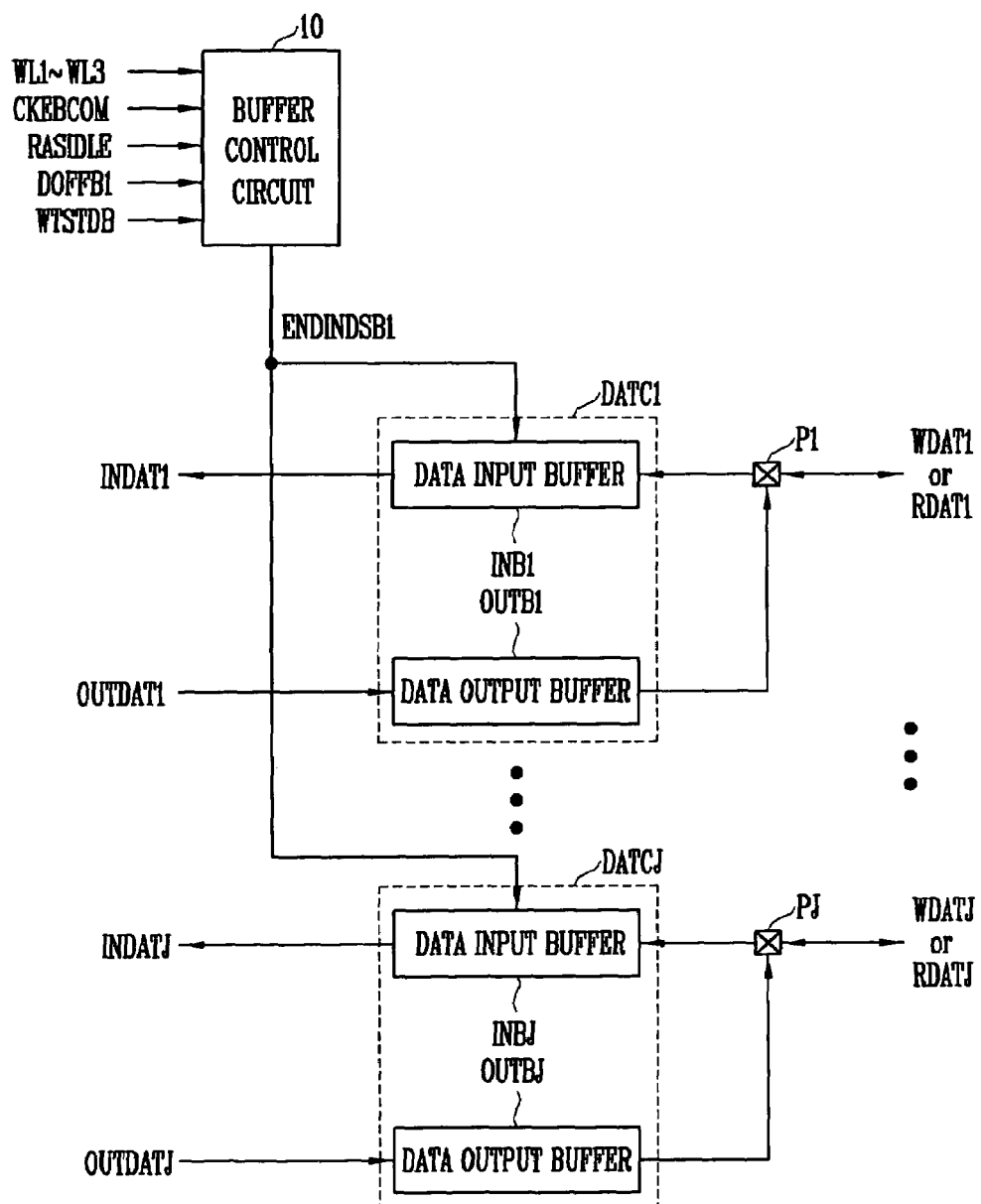
FIG. 1 is a block diagram of a buffer control circuit and data I/O circuits of a semiconductor memory device in the related art.
Figure 2:
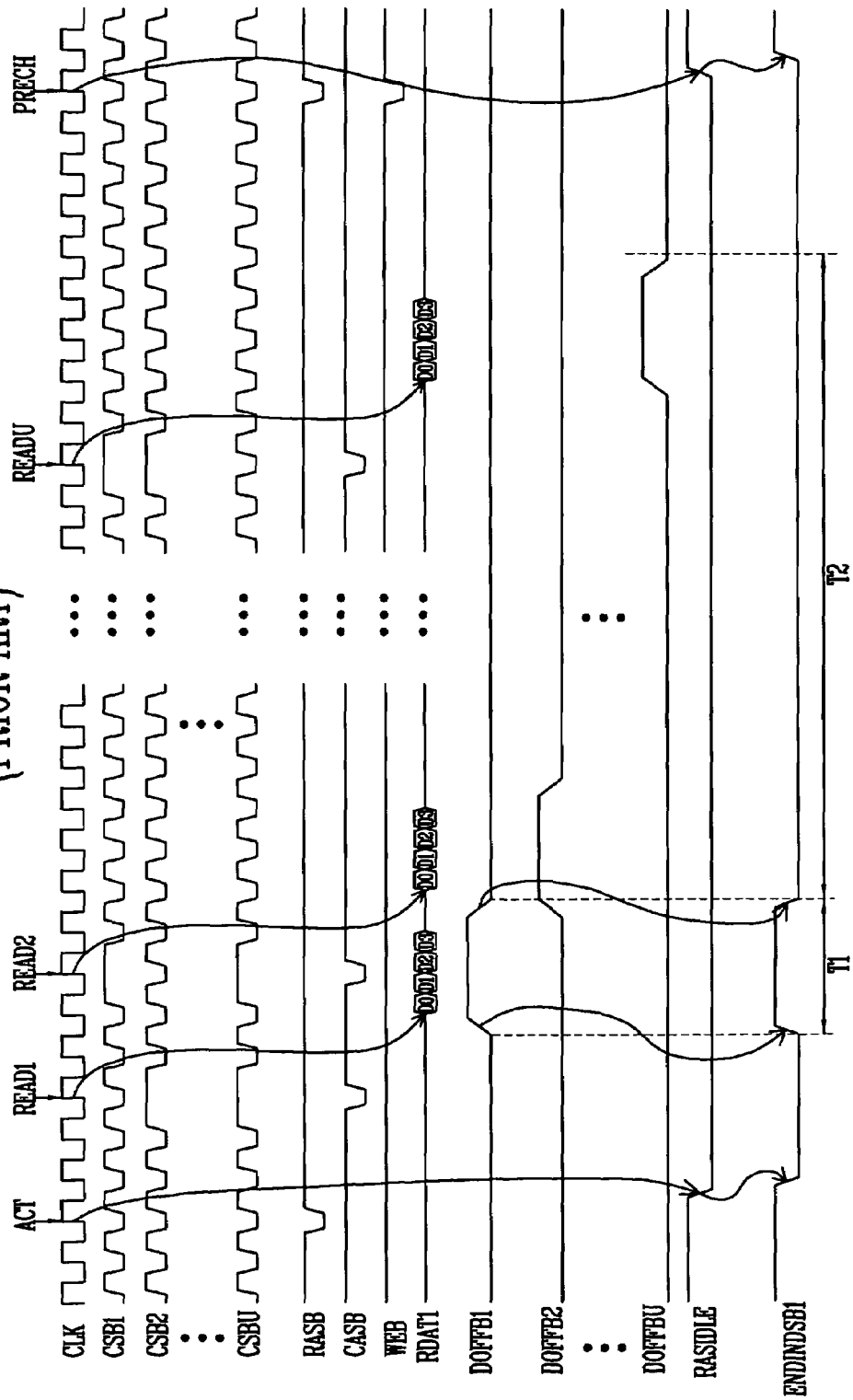
FIG. 2 is a timing diagram illustrating signals related to the operation of the buffer control circuit shown in FIG. 1.
Figure 3:
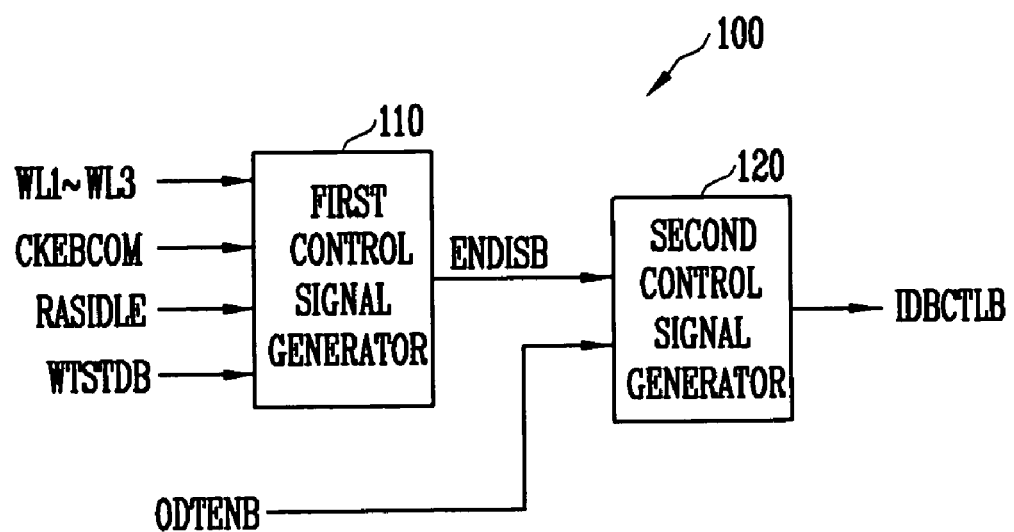
FIG. 3 is a block diagram of a buffer control circuit according to an embodiment of the present invention.

FIG. 3 is a block diagram of a buffer control circuit according to an embodiment of the present invention. Referring to FIG. 3, a buffer control circuit 100 includes a first control signal generator 110, and a second control signal generator 120.

The first control signal generator 110 generates an internal buffer control signal ENDISB in response to write latency signals WL1 to WL3 and internal control signals CKEB-COM, RASIDLE, and WTSTDB. The write latency signals WL1 to WL3 are respectively enabled or disabled according to write latency set in a semiconductor memory device (for example, SMD1) (refer to FIG. 6), which includes the buffer control circuit 100.

The term "write latency" refers to a time from which a write command is inputted to the semiconductor memory device SMD1 to when external input data IDQ1_1 to IDQ1_N (N is an integer) are inputted to data input buffers IDB1 to IDBN, respectively, of the semiconductor memory device SMD1.

For example, when the write latency is 1 (i.e., 1tCK (1tCK=1 clock cycle)), the write latency signal WL1 is enabled and the write latency signals WL2, WL3 are disabled. Furthermore, when the write latency is 2 (i.e., 2tCK), the write latency signal WL2 is enabled and the write latency signals WL1, WL3 are disabled. Furthermore, when the write latency is 3 (i.e., 3tCK), the write latency signal WL3 is enabled and the write latency signals WL1, WL2 are disabled.

The internal control signal CKEBCOM is disabled when the internal clock signal CLK of the semiconductor memory device SMD1 is toggled. The internal control signal RASIDLE is disabled in synchronization with an active command ACT (refer to FIG. 7) when the active command ACT is inputted to the semiconductor memory device SMD1 and is enabled in synchronization with a precharge command PRECH1 (refer to FIG. 7) when the precharge command PRECH1 is inputted to the semiconductor memory device SMD1.

The internal control signal WTSTDB is generated by a control circuit (not shown) based on the write command input to the semiconductor memory device SMD1, and write latency and a burst length set in the semiconductor memory device SMD1. In more detail, the control circuit disables the internal control signal WTSTDB for a time decided by the write latency and the burse length in response to the write command.

At this time, it is assumed that a point of time at which the write command is inputted to the semiconductor memory device SMD1 is "A" and delay time when the internal control signal WTSTDB is disabled from the point of time A1 is "ΔD". In this case, the internal control signal WTSTDB is disabled at a point of time (A+ΔD+[(WL−1)×1tCK]) and keeps disabled during a time ([(BL/2)+2]×1tCK). "WL" denotes write latency set in the semiconductor memory device SMD1 and "BL" denotes a burst length set in the semiconductor memory device SMD1. Meanwhile, "ΔD" denotes a delay time at which the internal clock signal CLK is generated asynchronously. Accordingly, a point of time at which the internal control signal WTSTDB is disabled may be varied depending on "ΔD".

The second control signal generator 120 generates a buffer control signal IDBCTLB in response to the internal buffer control signal ENDISB and a termination control signal ODTENB. The termination control signal ODTENB is enabled while it is decided by a read command input to the semiconductor memory device SMD1 during the read operation and Column Address Strobe (CAS) latency and a burst length set in the semiconductor memory device SMD1.

In more detail, assuming that a point of time delayed as much as CAS latency after the read command is inputted to the semiconductor memory device SMD1 is "B", the termination control signal ODTENB is enabled at a point of time (B+[(CL−1)×1tCK]) and then keeps enabled during a time ([(BL/2)+2]×1tCK). The reason why the termination control signal ODTENB keeps enabled during the time [(BL/2)+2]× 1tCK) is that external output data (for example, ODQ1_1) (refer to FIG. 6) can be output from the semiconductor memory device SMD1 stably.

That is, in the case where an termination unit ODT1 is enabled while a data output buffer ODB1 that shares an I/O buffer IOP1 together with a data input buffer (for example, IDB1) (refer to FIG. 6) outputs the external output data ODQ1_1 to the I/O buffer IOP1, the data output buffer ODB1 cannot output the external output data ODQ1_1 stably. For this reason, it is preferred that a point of time at which the termination control signal ODTENB is enabled is one clock cycle earlier that that at which the data output buffer ODB1 outputs the external output data ODQ1_1. It is also preferred that a point of time at which the termination control signal ODTENB is disabled one clock cycle later than that at which the data output buffer ODB1 completes the output operation of the external output data ODQ1_1.

Meanwhile, termination units ODT1 to ODTN (refer to FIG. 6) included in the semiconductor memory device SMD1 are enabled or disabled in response to the termination control signal ODTENB. In more detail, when the termination control signal ODTENB is enabled, the termination units ODT1 to ODTN are disabled.

The construction and operation of the first control signal generator 110 and the second control signal generator 120 will be described in more detail below with reference to FIGS. 4 and 5.

Figure 4:
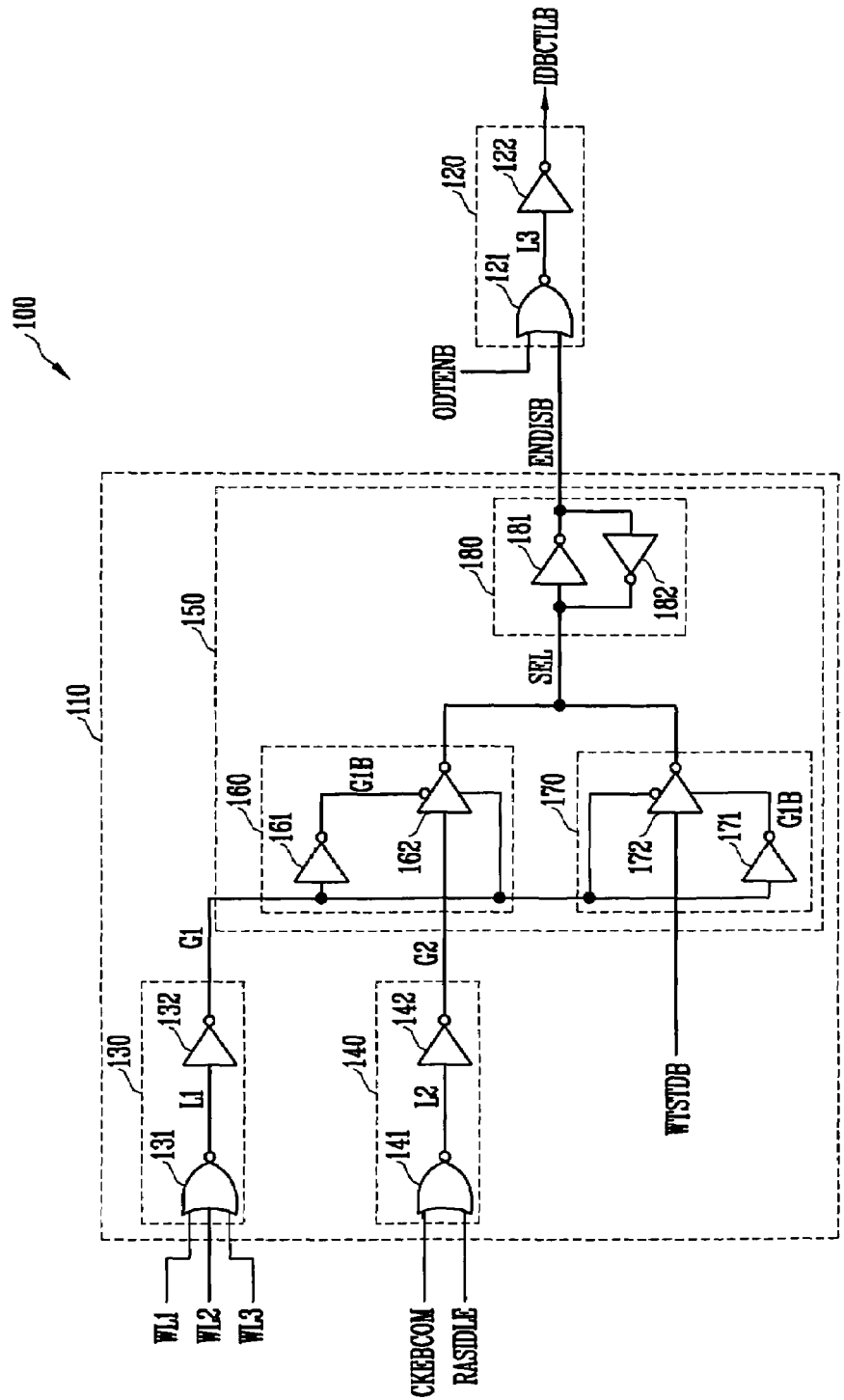
FIG. 4 is one detailed circuit diagram of the buffer control circuit shown in FIG. 3 according to an embodiment of the present invention.
Figure 5:
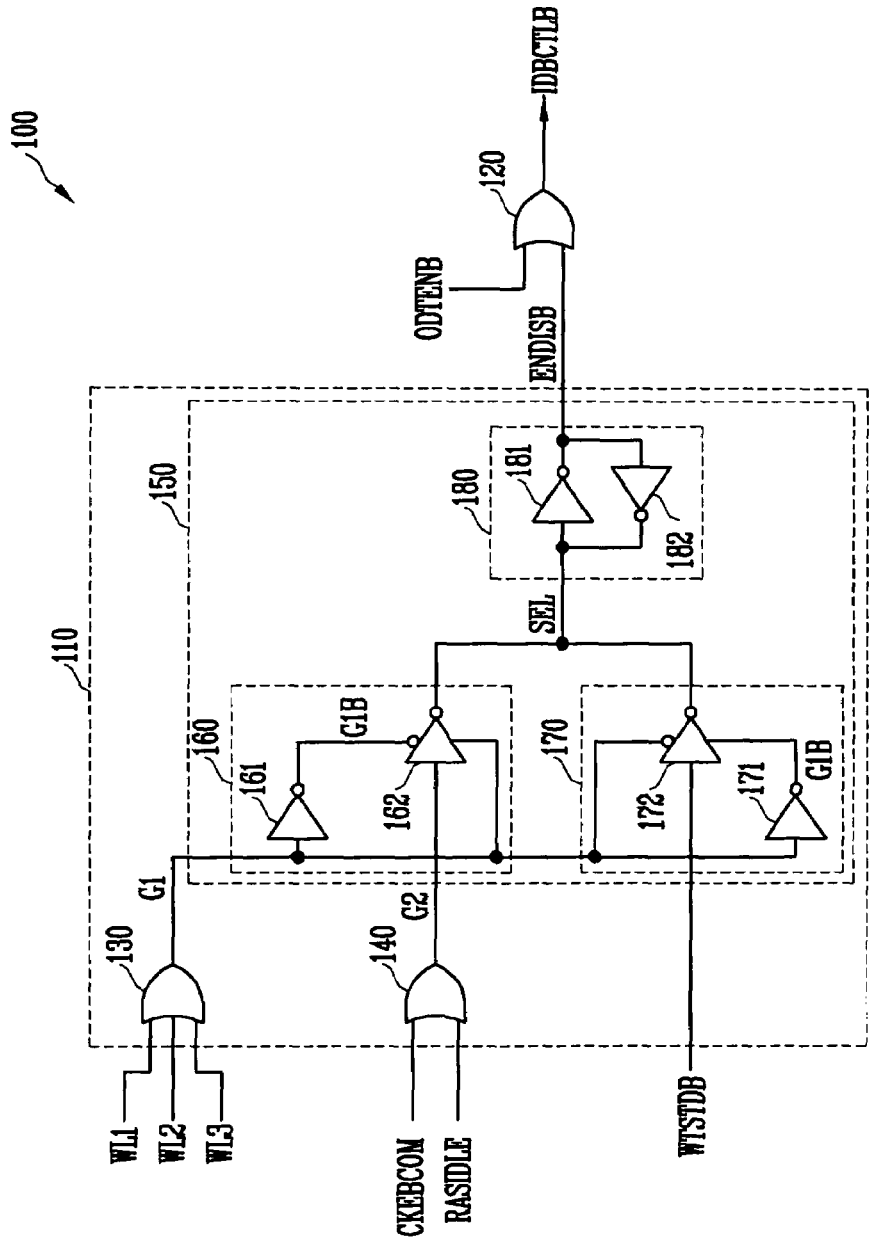
FIG. 5 is another detailed circuit diagram of the buffer control circuit shown in FIG. 3 according to an embodiment of the present invention.

Referring to FIG. 4, the first control signal generator 110 includes internal logic circuits 130, 140 and a select output circuit 150.

The internal logic circuit 130 outputs a selection control signal G1 in response to the write latency signals WL1 to WL3. In more detail, when any one of the write latency signals WL1 to WL3 is enabled, the internal logic circuit 130 enables the selection control signal G1.

The internal logic circuit 130 includes a NOR gate 131 and an inverter 132. The NOR gate 131 outputs an internal logic signal L1 in response to the write latency signals WL1 to WL3. The inverter 132 inverts the internal logic signal L1 and outputs an inverted signal as the selection control signal G1. Alternatively, as shown in FIG. 5, the internal logic circuit 130 may be implemented using an OR gate.

The internal logic circuit 140 generates a control logic signal G2 in response to the internal control signals CKEB-COM, RASIDLE. In more detail, when one of the internal control signals CKEBCOM, RASIDLE is enabled, the internal logic circuit 140 enables the control logic signal G2.

The internal logic circuit 140 includes a NOR gate 141 and an inverter 142. The NOR gate 141 outputs an internal logic signal L2 in response to the internal control signals CKEB-COM, RASIDLE. The inverter 142 inverts the internal logic signal L2 and outputs an inverted signal as the control logic signal G2. Alternatively, as shown in FIG. 5, the internal logic circuit 140 may be implemented using an OR gate.

The select output circuit 150 includes selection circuits 160, 170 and a latch circuit 180.

The selection circuit 160 receives the control logic signal G2 in response to the selection control signal G1 and outputs the signal G2 as a selection signal SEL. The selection circuit 160 includes inverters 161, 162. The inverter 161 inverts the selection control signal G1 and outputs an inverted selection control signal G1B. The inverter 162 may be implemented using a tri-state inverter. The inverter 162 is enabled or disabled in response to the selection control signal G1 and the inverted selection control signal G1B. Preferably, when the selection control signal G1 is enabled, the inverter 162 may be enabled to receive the control logic signal G2 and to output the control logic signal G2 as the selection signal SEL. In more detail, the inverter 162 inverts the control logic signal G2 and outputs an inverted signal as the selection signal SEL.

The selection circuit 170 receives the internal control signal WTSTDB in response to the selection control signal G1 and outputs the signal as the selection signal SEL. The selection circuit 170 includes inverters 171, 172. The inverter 171 inverts the selection control signal G1 and outputs an inverted selection control signal G1B. The inverter 172 may also be implemented using a tri-state inverter in a similar way to the inverter 162. The inverter 172 is enabled or disabled in response to the selection control signal G1 and the inverted selection control signal G1B. Preferably, when the selection control signal G1 is disabled, the inverter 172 may be enabled to receive the internal control signal WTSTDB and to output the internal control signal WTSTDB as the selection signal SEL. In more detail, the inverter 172 inverts the internal control signal WTSTDB and outputs an inverted signal as the selection signal SEL. Preferably, when one of the inverters 162, 172 is enabled, the other of the inverters 162, 172 is disabled. Consequently, when one of the selection circuits 160, 170 performs the output operation of the selection signal SEL, the other of the selection circuits 160, 170 stops the output operation of the selection signal SEL.

The latch circuit 180 includes inverters 181, 182. The latch circuit 180 latches the selection signal SEL and outputs a latched signal as the internal buffer control signal ENDISB. As a result, when any one of the write latency signals WL1 to WL3 is enabled, the first control signal generator 110 outputs the internal buffer control signal ENDISB in response to the internal control signals CKEBCOM, RASIDLE.

Furthermore, when all the write latency signals WL1 to WL3 are disabled (i.e., when the write latency set in the semiconductor memory device is greater than 3), the first control signal generator 110 outputs the internal buffer control signal ENDISB in response to the internal control signal WTSTDB. The reason why the first control signal generator 110 does not use the internal control signal WTSTDB when the write latency is smaller than 3 as described above is that the internal control signal WTSTDB is disabled at a point of time $(A+\Delta D+[(WL-1)\times 1tCK])$. This will be described in more detail below.

As the operating frequency of the semiconductor memory device increases, the cycle of the internal clock signal CLK reduces. Accordingly, a point of time at which external input data are inputted to the semiconductor memory device becomes more fast. However, since the time $\Delta D$ is a signal asynchronous to the internal clock signal CLK, a point of time at which the internal control signal WTSTDB is disabled is slower than that at which the external input data are input.

Accordingly, the first control signal generator 110 outputs the internal buffer control signal ENDISB in response to the internal control signal WTSTDB and the second control signal generator 120 outputs the buffer control signal IDBCTLB in response to the internal buffer control signal ENDISB. Consequently, the point of time at which the data input buffer is enabled in response to the buffer control signal IDBCTLB becomes slower than that at which the external input data are input.

The second control signal generator 120 includes a NOR gate 121 and an inverter 122. The NOR gate 121 outputs an internal logic signal L3 in response to the internal buffer control signal ENDISB and the termination control signal ODTENB. The inverter 122 inverts the internal logic signal L3 and outputs an inverted signal as the buffer control signal IDBCTLB. Alternatively, as shown in FIG. 5, the second control signal generator 120 may be implemented using an OR gate.

As described above, the buffer control circuit 100 outputs the buffer control signal IDBCTLB such that the data input buffer is disabled not only during a period in which a semiconductor memory device including the buffer control circuit 100 actually performs the read operation, but also during a period in which the termination control signal ODTENB is enabled (i.e., a period in which the termination unit is disabled). Accordingly, the buffer control circuit 100 can prevent unnecessary operations of the data input buffer, thereby reducing unnecessary power consumption.

Figure 6:
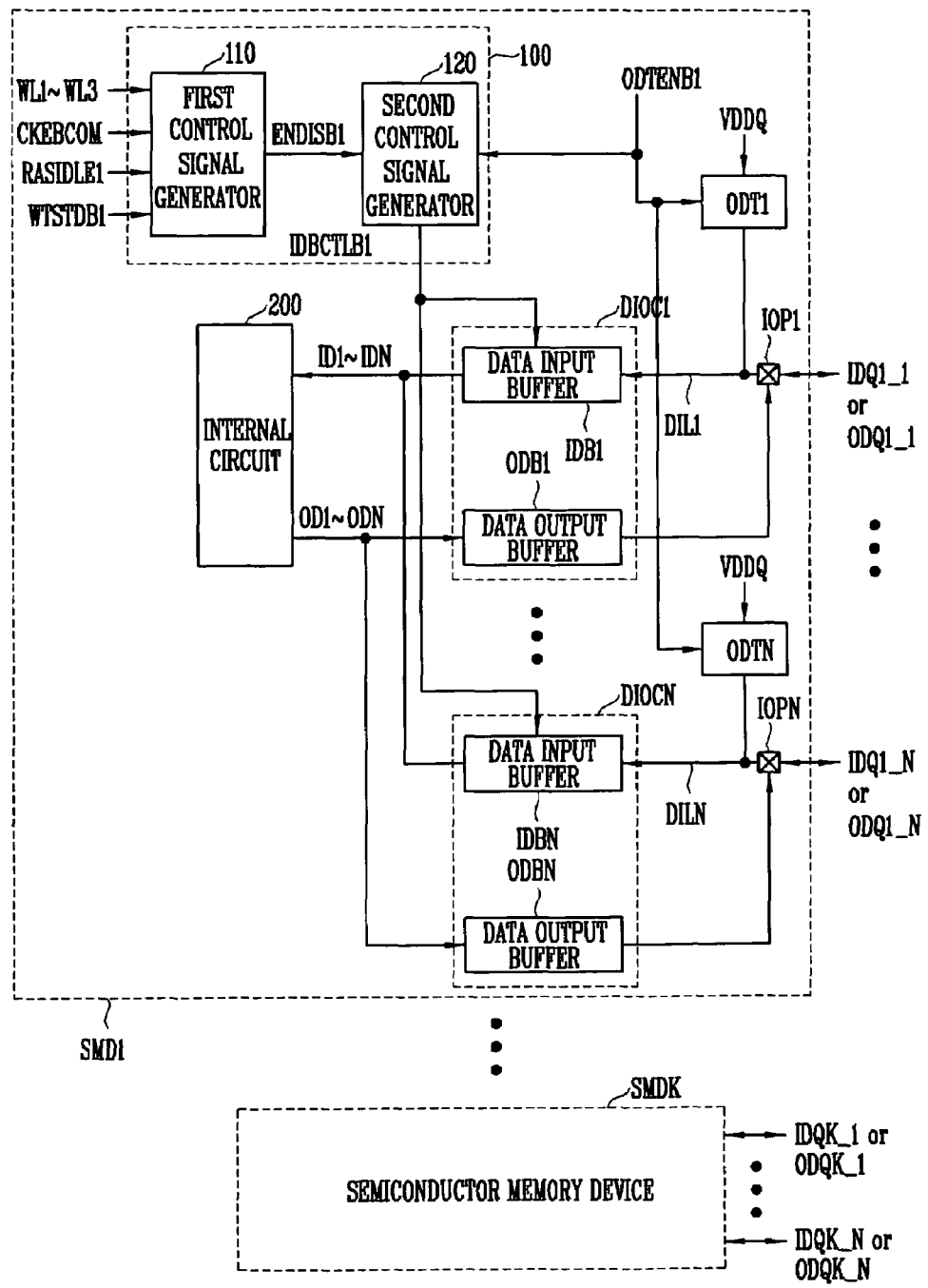
FIG. 6 is a block diagram of semiconductor memory devices for a memory module according to an embodiment of the present invention.

FIG. 6 is a block diagram of semiconductor memory devices for a memory module according to an embodiment of the present invention. FIG. 6 illustrates an example in which the semiconductor memory devices SMD1 to SMDK (K is an integer) are included in one memory module. The semiconductor memory devices SMD1 to SMDK have the same construction and operations and only the semiconductor memory device SMD1 will be described below as an example.

The semiconductor memory device SMD1 includes a buffer control circuit 100, an internal circuit 200, data I/O circuits DIOC1 to DIOCN (N is an integer), and termination units ODT1 to ODTN (N is an integer).

The buffer control circuit 100 includes a first control signal generator 110 and a second control signal generator 120. The construction and operation of the first control signal generator 110 and the second control signal generator 120 are substantially the same as those that have been described with reference to FIGS. 3 to 5. Description thereof will be omitted for simplicity.

The internal circuit 200 includes a core circuit (not shown). Each of the data I/O circuits DIOC1 to DIOCN includes a data input buffer and a data output buffer. For example, the data I/O circuit DIOC1 may include a data input buffer IDB1 and a data output buffer ODB1 and the data I/O circuit DIOCN may include a data input buffer IDBN and a data output buffer ODBN. The data input buffers IDB1 to IDBN are connected to I/O pads IOP1 to IOPN, respectively, through data input lines DIL1 to DILN, respectively.

During the write operation of the semiconductor memory device SMD1, the data input buffers IDB1 to IDBN receive the external input data IDQ1_1 to IDQ1_N, which are respectively inputted to the I/O pads IOP1 to IOPN, respectively, in response to a buffer control signal IDBCTLB1 generated by the buffer control circuit 100, and output internal input data ID1 to IDN, respectively, to the internal circuit 200.

During the read operation of the semiconductor memory device SMD1, the data output buffers ODB1 to ODBN receive internal output data OD1 to ODN, respectively, from the internal circuit 200 and output external output data ODQ1_1 to ODQ1_N, respectively, to the I/O pads IOP1 to IOPN, respectively.

The termination units ODT1 to ODTN are connected to the data input lines DIL1 to DILN, respectively. The termination units ODT1 to ODTN are enabled or disabled in response to a termination control signal ODTENB. Preferably, when the termination control signal ODTENB is disabled, the termination units ODT1 to ODTN may be enabled. When the termination units ODT1 to ODTN are enabled, they match the impedances of the data input lines DIL1 to DILN to preset values, respectively, thereby minimizing the distortion of the external input data IDQ1_1 to IDQ1_N inputted to the semiconductor memory device SMD1.

A circuit designer may use various types of On-Die Termination (ODT) schemes as the termination units ODT1 to ODTN of the semiconductor memory device SMD1. For example, each of the termination units ODT1 to ODTN may be implemented using a PMOS transistor. In this case, a resistance value of the PMOS transistor may be set to be appropriate for matching one of the impedances of the data input line DIL1 to DILN to a set value.

Furthermore, in the case where each of the termination units ODT1 to ODTN is implemented using a PMOS transistor, the PMOS transistor has a source connected to an internal voltage VDDQ and a drain connected to one of the data input line DIL1 to DILN though not shown in FIG. 6. In addition, the PMOS transistor has a gate to which the termination control signal ODTENB is inputted. When the termination control signal ODTENB is disabled, the PMOS transistor is turned on to supply the internal voltage VDDQ to any one of the data input lines DIL1 to DILN. To the contrary, when the termination control signal ODTENB is enabled, the PMOS transistor is turned off.

A method of allowing the buffer control circuit 100 to control the operation of each of the data input buffers IDB1 to IDBN will be described in more detail below with reference to FIG. 7. In the present embodiment, only the operation of the buffer control circuit 100 of the semiconductor memory device SMD1 will be described as an example.

For convenience of description, it is assumed that the CAS latency and the write latency set in each of the semiconductor memory devices SMD1 to SMDK are 2, respectively, and a burst length is 4. It is also assumed that the active command ACT is inputted to the semiconductor memory devices SMD1 to SMDK at the same time, and after read commands READ1 to READK are sequentially inputted to the semiconductor memory devices SMD1 to SMDK, a precharge command PRECHK is inputted to the semiconductor memory devices SMD1 to SMDK at the same time.

Figure 7:
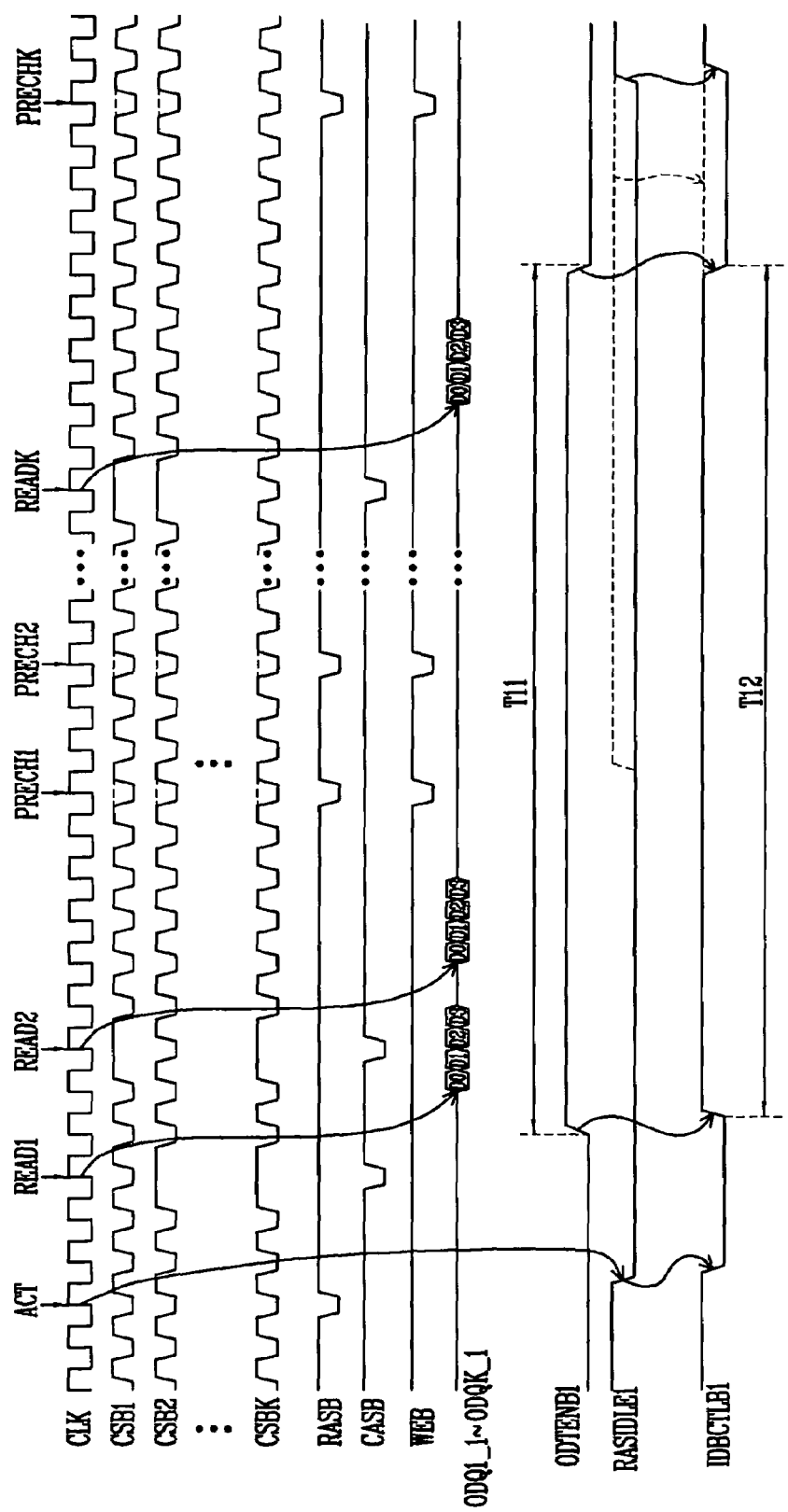
FIG. 7 is a timing diagram illustrating signals related to the operation of the buffer control circuit shown in FIG. 6 according to an embodiment of the present invention.

In FIG. 7, chip selection signals CSB1 to CSBK (K is an integer) are signals for selecting the semiconductor memory devices SMD1 to SMDK, respectively. Furthermore, the semiconductor memory devices SMD1 to SMDK are commonly applied with a Row Address Strobe (RAS) control signal RASB, a CAS control signal CASB, and a write enable signal WEB.

If the internal clock signal CLK is toggled, the internal control signal CLEBCOM is disabled. Thereafter, if the entire chip selection signals CSB1 to CSBK and the RAS control signal RASB become logical lows and the active command ACT is inputted to the semiconductor memory devices SMD1 to SMDK at the same time, each of the semiconductor memory devices SMD1 to SMDK becomes active.

Alternatively, the active command ACT may be selectively inputted to one or a part of the semiconductor memory devices SMD1 to SMDK. In this case, a part of the chip selection signals CSB1 to CSBK, which correspond to the remaining semiconductor memory devices other than a semiconductor memory device that must be activated, are kept to logical highs.

The internal control signal RASIDLE1 corresponding to the semiconductor memory device SMD1 is disabled when the active command ACT is inputted to the semiconductor memory device SMD1. Thereafter, the internal control signal RASIDLE1 keeps disabled until the precharge command PRECHK is inputted to the semiconductor memory device SMD1.

Meanwhile, since the write latency set in the semiconductor memory device SMD1 is 2, the write latency signal WL2 is enabled and the write latency signals WL1, WL3 are disabled. As a result, the first control signal generator 110 of the buffer control circuit 100 generates an internal buffer control signal ENDISB1 in response to the internal control signals RASIDLE1, WTSTDB1. Since the internal control signal RASIDLE1 has been disabled, the first control signal generator 110 disables the internal buffer control signal ENDISB1. The termination control signal ODTENB1 is initially disabled. Accordingly, the termination units ODT1 to ODTN of the semiconductor memory device SMD1 are enabled in response to the termination control signal ODTENB1.

The second control signal generator 120 of the buffer control circuit 100 disables the buffer control signal IDBCTLB1 in response to the termination control signal ODTENB1 and the internal buffer control signal ENDISB1. As a result, the data input buffers IDB1 to IDBN of the semiconductor memory device SMD1 are enabled in response to the buffer control signal IDBCTLB1.

Thereafter, if the read command READ1 is inputted to the semiconductor memory devices SMD1 to SMDK at the same time when the CAS control signal CASB and the chip selection signal CSB1 become logical lows and the chip selection signals CSB2 to CSBK become logical highs, the semiconductor memory device SMD1 performs the read operation. At this time, the semiconductor memory devices SMD2 to SMDK do not perform the read operation.

Meanwhile, the termination control signal ODTENB1 is enabled at a point of time TM. Thereafter, since the burst length is 4 bits, the termination control signal ODTENB1 keeps enabled during 4tCK. The second control signal generator 120 of the semiconductor memory device SMD1 enables the buffer control signal IDBCTLB1 in response to the termination control signal ODTENB1. As a result, the data input buffers IDB1 to IDBN of the semiconductor memory device SMD1 are disabled in response to the buffer control signal IDBCTLB1.

When the CAS control signal CASB and the chip selection signal CSB2 become logical lows and the chip selection signals CSB1, CSB3 to CSBK become logical highs after 4tCK, the read command READ2 is inputted to the semiconductor memory devices SMD1 to SMDK at the same time. Accordingly, the semiconductor memory device SMD2 performs the read operation, but the semiconductor memory devices SMD1, SMD3 to SMDK do not perform the read operation.

Since the read command READ2 is inputted to the semiconductor memory device SMD1 after 4tCK, the termination control signal ODTENB1 keeps enabled by the read command READ2. As shown in FIG. 7, since the semiconductor memory device SMD1 receives one of the read commands READ3 to READK every 3tCK, the termination control signal ODTENB1 keeps enabled for a time T11 and is then disabled.

Accordingly, the second control signal generator 120 of the semiconductor memory device SMD1 enables the buffer control signal IDBCTLB1 until the read operations of the semiconductor memory devices SMD1 to SMDK are all completed (i.e., a time T12), and then disables the buffer control signal IDBCTLB1, in response to the termination control signal ODTENB1.

As a result, the data input buffers IDB1 to IDBN of the semiconductor memory device SMD1 keep disabled during the time T12 and are then enabled. Consequently, during the time T12, unnecessary power consumption by the data input buffers IDB1 to IDBN can be reduced.

Thereafter, if the precharge command PRECHK is inputted to the semiconductor memory devices SMD1 to SMDK at the same time when the RAS control signal RASB, the write enable signal WEB, and the chip selection signals CSB1 to CSBK become logical lows, the semiconductor memory devices SMD1 to SMDK perform the precharge operation. The internal control signal RASIDLE1 is enabled when the precharge command PRECHK is inputted to the semiconductor memory device SMD1.

When the internal control signal RASIDLE1 is enabled, the first control signal generator 110 enables the internal buffer control signal ENDISB1. The second control signal generator 120 enables the buffer control signal IDBCTLB1 in response to the internal buffer control signal ENDISB1. As a result, the data input buffers IDB1 to IDBN of the semiconductor memory device SMD1 are disabled again in response to the buffer control signal IDBCTLB1.

Alternatively, the precharge operations of the semiconductor memory devices SMD1 to SMDK may selectively be executed one by one. In this case, the precharge commands PRECH1 to PRECHK shown in FIG. 7 decide the precharge operation times of the semiconductor memory devices SMD1 to SMDK, respectively. This will be described in more detail below.

If the precharge command PRECHK is inputted to the semiconductor memory devices SMD1 to SMDK at the same time when the RAS control signal RASB, the write enable signal WEB, and the chip selection signal CSB1 become logical lows, the semiconductor memory device SMD1 performs the precharge operation. Meanwhile, when the precharge command PRECHK is inputted to the semiconductor memory devices SMD1 to SMDK, the chip selection signals CSB2 to CSBK become logical highs as indicated by a dotted line in FIG. 7. Accordingly, the semiconductor memory devices SMD2 to SMDK do not perform the precharge operation. Furthermore, when the precharge command PRECH1 is inputted to the semiconductor memory device SMD1, the internal control signal RASIDLE1 is enabled as indicated by a dotted line in FIG. 7.

When the internal control signal RASIDLE1 is enabled, the first control signal generator 110 enables the internal buffer control signal ENDISB1. The second control signal generator 120 enables the buffer control signal IDBCTLB1 in response to the internal buffer control signal ENDISB1. As a result, the buffer control signal IDBCTLB1 is enabled at the point of time TM and then keeps enabled as indicated by a dotted line in FIG. 7. Thereafter, the precharge operations of the semiconductor memory devices SMD2 to SMDK are performed in a similar way to the precharge operation of the semiconductor memory device SMD1.

As described above, in the semiconductor memory device SMD1, the buffer control circuit 100 generates the buffer control signal IDBCTLB1 in response to the termination control signal ODTENB1. Accordingly, unnecessary power consumption by the data input buffers IDB1 to IDBN can be reduced. Furthermore, the buffer control circuit 100 disposed close to the data input buffers IDB1 to IDBN employs the termination control signal ODTENB1 to control the termination units ODT1 to ODTN. Accordingly, a designer can easily route the signal line SL for transferring the termination control signal ODTENB1 in the buffer control circuit 100.

Figure 8:
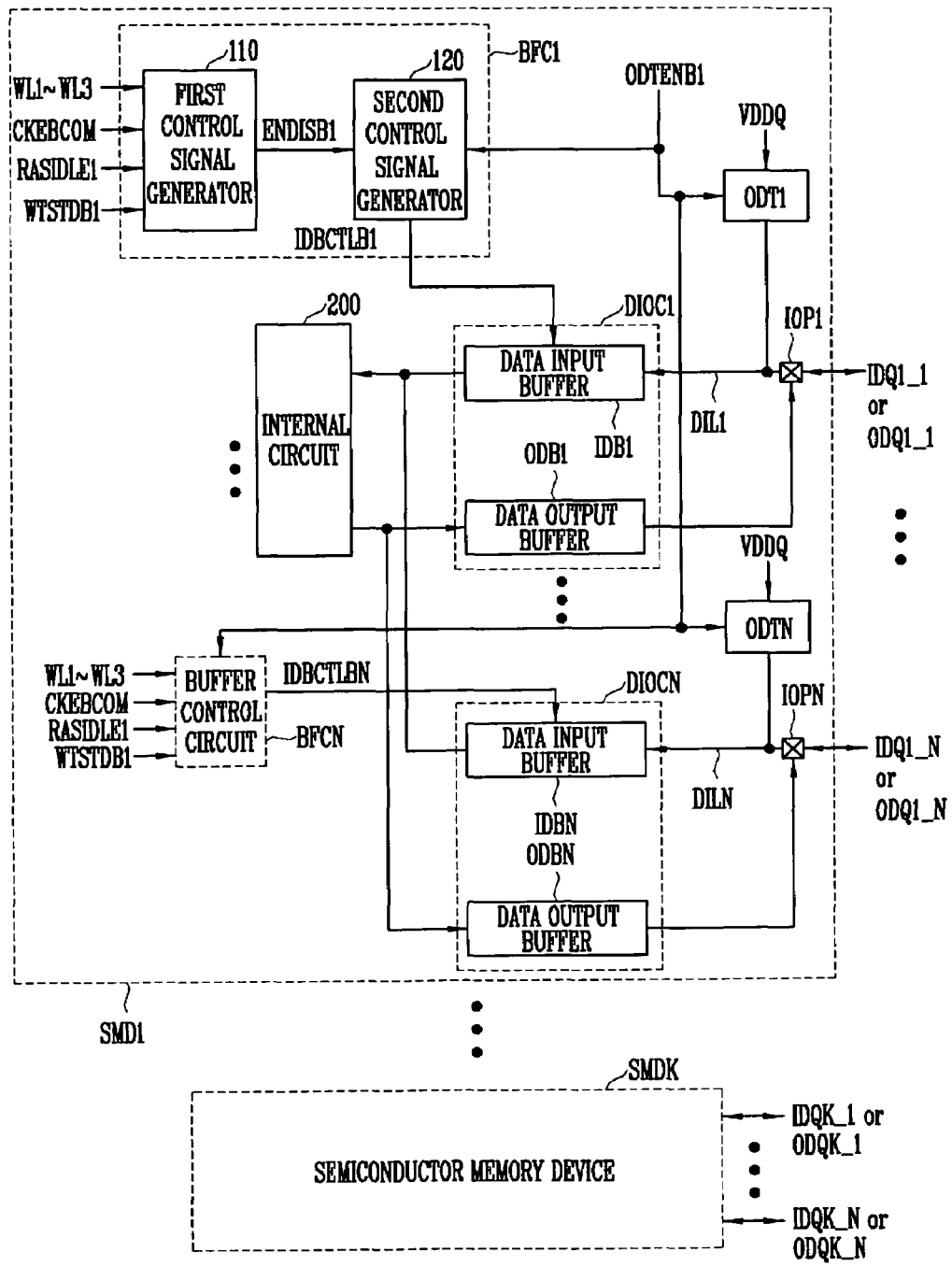
FIG. 8 is a block diagram of semiconductor memory devices for a memory module according to another embodiment of the present invention.

FIG. 8 is a block diagram of semiconductor memory devices for a memory module according to another embodiment of the present invention. The construction and operation of each of the semiconductor memory devices SMD1 to SMDK shown in FIG. 8 are substantially the same as those that have been described with reference to FIG. 6 except for one thing. Therefore, only the difference will be described in the present embodiment. Furthermore, in FIG. 8, the semiconductor memory devices SMD1 to SMDK have the same construction and operations and only the semiconductor memory device SMD1 will be described below as an example.

The construction of the semiconductor memory device SMD1 shown in FIG. 8 is different from that shown in FIG. 6 in that the buffer control circuit 100 is replaced with the buffer control circuits BFC1 to BFCN. Each of the buffer control circuits BFC1 to BFCN generates one of the buffer control signal IDBCTLB1 to IDBCTLBN in response to the write latency signals WL1 to WL3 and the internal control signals CKEBCOM, RASIDLE1, and WTSTDB1. As a result, the data input buffers IDB1 to IDBN are enabled or disabled in response to the buffer control signals IDBCTLB1 to IDBCTLBN, respectively.

In the case where the data input buffers IDB1 to IDBN are controlled according to the buffer control signal IDBCTLB1 to IDBCTLBN, respectively, as described above, the data input buffers IDB1 to IDBN can be enabled or disabled much rapidly compared with the data input buffers IDB1 to IDBN shown in FIG. 6. This is because a delay time which is taken for the buffer control signals IDBCTLB1 to IDBCTLBN to reach the data input buffers IDB1 to IDBN is shortened since the buffer control circuits BFC1 to BFCN are disposed corresponding to the data input buffers IDB1 to IDBN, respectively.

As described above, in accordance with the buffer control circuit, the semiconductor memory device for the memory module including the buffer control circuit, and control method of the buffer control circuit according to the present invention, a buffer control signal is generated based on a control signal for a termination unit. It is therefore possible to reduce unnecessary power consumption incurred by a data input buffer.

Furthermore, a design work for routing the signal line for transferring the control signal for the termination unit in the buffer control circuit can be facilitated.

While the invention has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims.

What is claimed is:

1. A buffer control circuit comprising:
   a first control signal generator that generates an internal buffer control signal in response to write latency signals and internal control signals; and
   a second control signal generator that generates a buffer control signal in response to the internal buffer control signal and a termination control signal.

2. The buffer control circuit as claimed in claim 1, wherein the termination control signal is enabled for a predetermined time during a read operation of a semiconductor memory device including a termination unit and the buffer control circuit,
   the predetermined time is decided by a read command inputted to the semiconductor memory device, and Column Address Strobe (CAS) latency and a burst length set in the semiconductor memory device, and
   the termination unit is enabled or disabled in response to the termination control signal.

3. The buffer control circuit as claimed in claim 2, wherein the write latency signals include first to third write latency signals, and
   each of the first to third write latency signals is enabled or disabled according to write latency set in the semiconductor memory device.

4. The buffer control circuit as claimed in claim 2, wherein the internal control signals include first to third internal control signals,
   the first internal control signal is disabled when an internal clock signal of the semiconductor memory device is toggled,
   the second internal control signal is disabled when an active command is inputted to the semiconductor memory device and is enabled when a precharge command is inputted to the semiconductor memory device, and
   the third internal control signal is generated based on a write command inputted to the semiconductor memory device, and write latency and a burst length set in the semiconductor memory device.

5. The buffer control circuit as claimed in claim 4, wherein the first control signal generator comprises:
   a first internal logic circuit that outputs a selection control signal in response to the write latency signals;
   a second internal logic circuit that outputs a control logic signal in response to the first and second internal control signals; and
   a select output circuit that selects one of the control logic signal and the third internal control signal and outputs a selected signal as the internal buffer control signal, in response to the selection control signal.

6. The buffer control circuit as claimed in claim 5, wherein the first internal logic circuit comprises:
   a NOR gate that outputs an internal logic signal in response to the write latency signals; and
   an inverter that inverts the internal logic signal and outputs an inverted signal as the selection control signal.

7. The buffer control circuit as claimed in claim 5, wherein the first internal logic circuit is an OR gate.

8. The buffer control circuit as claimed in claim 5, wherein the second internal logic circuit comprises:
   a NOR gate that outputs an internal logic signal in response to the first and second internal control signals; and
   an inverter that inverts the internal logic signal and outputs an inverted signal as the control logic signal.

9. The buffer control circuit as claimed in claim 5, wherein the second internal logic circuit is an OR gate.

10. The buffer control circuit as claimed in claim 5, wherein the select output circuit comprises:
    a first selection circuit that receives the control logic signal and outputs the received control logic signal as a selection signal, in response to the selection control signal;
    a second selection circuit that receives the third internal control signal and outputs the received internal control signal as the selection signal, in response to the selection control signal; and
    a latch circuit that latches the selection signal and outputs a latched signal as the internal buffer control signal,
    wherein when one of the first and second selection circuits performs the output operation of the selection signal, the other of the first and second selection circuits stops the output operation of the selection signal.

11. The buffer control circuit as claimed in claim 1, wherein the second control signal generator comprises:
    a NOR gate that outputs an internal logic signal in response to the internal buffer control signal and the termination control signal; and
    an inverter that inverts the internal logic signal and outputs an inverted signal as the buffer control signal.

12. The buffer control circuit as claimed in claim 1, wherein the second control signal generator is an OR gate.

13. A semiconductor memory device for a memory module, comprising:
    a buffer control circuit that generates a buffer control signal in response to write latency signals, internal control signals, and a termination control signal;
    a plurality of data input buffers connected to a plurality of I/O pads, respectively, through a plurality of data input lines, wherein the data input buffers receive external inputted data, which are respectively inputted to the plurality of I/O pads, respectively, and output internal inputted data to an internal circuit including a core circuit, in response to the buffer control signal during a write operation of the semiconductor memory device; and
    a plurality of termination units that are connected to the plurality of data input lines, respectively, and match impedances of the plurality of data input lines to predetermined values, respectively, in response to the termination control signal.

14. The semiconductor memory device as claimed in claim 13, wherein the buffer control circuit comprise a first control signal generator that generates an internal buffer control signal in response to the write latency signals and the internal control signals, and
    a second control signal generator that generates the buffer control signal in response to the internal buffer control signal and the termination control signal.

15. The semiconductor memory device as claimed in claim 14, wherein the internal control signals include first to third internal control signals,
    the first internal control signal is disabled when an internal clock signal of the semiconductor memory device is toggled,
    the second internal control signal is disabled when an active command is inputted to the semiconductor memory device and is enabled when a precharge command is inputted to the semiconductor memory device, and
    the third internal control signal is generated based on a write command inputted to the semiconductor memory device, and write latency and a burst length set in the semiconductor memory device.

16. The semiconductor memory device as claimed in claim 15, wherein the first control signal generator comprises:
- a first internal logic circuit that outputs a selection control signal in response to the write latency signals;
- a second internal logic circuit that outputs a control logic signal in response to the first and second internal control signals; and
- a select output circuit that selects one of the control logic signal and the third internal control signal and outputs a selected signal as the internal buffer control signal, in response to the selection control signal.

17. The semiconductor memory device as claimed in claim 16, wherein the first internal logic circuit comprises:
- a NOR gate that outputs an internal logic signal in response to the write latency signals; and
- an inverter that inverts the internal logic signal and outputs an inverted signal as the selection control signal.

18. The semiconductor memory device as claimed in claim 16, wherein the second internal logic circuit comprises:
- a NOR gate that outputs an internal logic signal in response to the first and second internal control signals; and
- an inverter that inverts the internal logic signal and outputs an inverted signal as the control logic signal.

19. The semiconductor memory device as claimed in claim 16, wherein the select output circuit comprises:
- a first selection circuit that receives the control logic signal and outputs the received control logic signal as a selection signal, in response to the selection control signal;
- a second selection circuit that receives the third internal control signal and outputs the received internal control signal as the selection signal, in response to the selection control signal; and
- a latch circuit that latches the selection signal and outputs a latched signal as the internal buffer control signal,
- wherein when one of the first and second selection circuits performs the output operation of the selection signal, the other of the first and second selection circuits stops the output operation of the selection signal.

20. The semiconductor memory device as claimed in claim 14, wherein the second control signal generator comprises:
- a NOR gate that outputs an internal logic signal in response to the internal buffer control signal and the termination control signal; and
- an inverter that inverts the internal logic signal and outputs an inverted signal as the buffer control signal.

21. The semiconductor memory device as claimed in claim 13, wherein the termination control signal is enabled for a predetermined time during a read operation of the semiconductor memory device,
- the predetermined time is decided by a read command inputted to the semiconductor memory device, and CAS latency and a burst length set in the semiconductor memory device, and
- each of the plurality of termination units is disabled when the termination control signal is enabled.

22. The semiconductor memory device as claimed in claim 13, wherein the write latency signals include first to third write latency signals, and
- each of the first to third write latency signals is enabled or disabled according to write latency set in the semiconductor memory device.

23. The semiconductor memory device as claimed in claim 13, further comprising a plurality of data output buffers that receive internal output data, respectively, from the internal circuit, and output a plurality of external output data to the plurality of I/O pads, respectively, during a read operation of the semiconductor memory device.

24. A control method of a buffer control circuit that controls at least one data input buffer in a semiconductor memory device for a memory module, including the at least one data input buffer and at least one termination unit, the method comprising the steps of:
- generating an internal buffer control signal in response to write latency signals and internal control signals; and
- generating a buffer control signal in response to the internal buffer control signal and a termination control signal, thereby enabling or disabling the at least one data input buffer.

25. The control method as claimed in claim 24, wherein the termination control signal controls the operation of the at least one termination unit and is enabled for a predetermined time during a read operation of the semiconductor memory device, and
- the predetermined time is decided by a read command inputted to the semiconductor memory device, and CAS latency and a burst length set in the semiconductor memory device.

26. The control method as claimed in claim 24, wherein the write latency signals include first to third write latency signals, and
- each of the first to third write latency signals is enabled or disabled according to write latency set in the semiconductor memory device.

27. The control method as claimed in claim 24, wherein the internal control signals include first to third internal control signals,
- the first internal control signal is disabled when an internal clock signal of the semiconductor memory device is toggled,
- the second internal control signal is disabled when an active command is inputted to the semiconductor memory device and is enabled when a precharge command is inputted to the semiconductor memory device, and
- the third internal control signal is generated based on a write command inputted to the semiconductor memory device, and write latency and a burst length set in the semiconductor memory device.

28. The control method as claimed in claim 27, wherein the step of generating the internal buffer control signal comprises the steps of:
- generating a selection control signal in response to the write latency signals;
- generating a control logic signal in response to the first and second internal control signals; and
- selecting one of the control logic signal and the third internal control signal and outputting a selected signal as the internal buffer control signal, in response to the selection control signal.

29. The control method as claimed in claim 28, wherein the step of outputting the selected signal as the internal buffer control signal comprises the steps of:
- receiving one of the control logic signal and the third internal control signal and outputting a received signal as the selection signal, in response to the selection control signal; and
- latching the selection signal and outputting a latched signal as the internal buffer control signal.

30. The control method as claimed in claim 24, wherein in the step of enabling or disabling the at least one data input buffer, when one of the internal buffer control signal and the termination control signal is enabled, the buffer control signal is enabled, and when the buffer control signal is enabled, the at least one data input buffer is disabled.

31. A semiconductor memory device for a memory module, comprising:
- a plurality of buffer control circuits that generate a plurality of buffer control signals, respectively, in response to write latency signals, internal control signals, and a termination control signal, respectively;
- a plurality of data input buffers connected to a plurality of I/O pads, respectively, through a plurality of data input lines, wherein the data input buffers receive external input data, which are respectively inputted to the plurality of I/O pads, respectively, and output internal input data to an internal circuit including a core circuit, in response to the plurality of buffer control signals, respectively, during a write operation of the semiconductor memory device; and
- a plurality of termination units that are connected to the plurality of data input lines, respectively, and match impedances of the plurality of data input lines to predetermined values, respectively, in response to the termination control signal.

32. The semiconductor memory device as claimed in claim 31 wherein the buffer control circuit comprise a first control signal generator that generates an internal buffer control signal in response to the write latency signals and the internal control signals, and
- a second control signal generator that generates the buffer control signal in response to the internal buffer control signal and the termination control signal.

33. The semiconductor memory device as claimed in claim 31, wherein the termination control signal is enabled for a predetermined time during a read operation of the semiconductor memory device,
- the predetermined time is decided by a read command inputted to the semiconductor memory device, and CAS latency and a burst length set in the semiconductor memory device, and
- each of the plurality of termination units is disabled when the termination control signal is enabled.

* * * * *